(12) United States Patent
Huang et al.

(10) Patent No.: US 8,488,322 B2
(45) Date of Patent: Jul. 16, 2013

(54) THIN FASTENER OF HEAT SINK

(75) Inventors: Meng-Cheng Huang, Taipei (TW); Chi-Chung Tseng, Taipei (TW)

(73) Assignee: Chaun-Choung Technology Corp., New Taipei (TW)

( * ) Notice: Subject to any disclaimer, the term of this patent is extended or adjusted under 35 U.S.C. 154(b) by 300 days.

(21) Appl. No.: 12/914,903

(22) Filed: Oct. 28, 2010

(65) Prior Publication Data

US 2012/0106088 A1 May 3, 2012

(51) Int. Cl.
*H05K 7/20* (2006.01)
*F28F 7/00* (2006.01)
*F28D 15/00* (2006.01)

(52) U.S. Cl.
USPC ............. 361/700; 165/80.3; 165/104.33; 165/185; 361/704; 361/719

(58) Field of Classification Search
USPC ........... 361/679, 52, 700, 679.46–679.47, 361/679.52
See application file for complete search history.

(56) References Cited

U.S. PATENT DOCUMENTS

| | | | | |
|---|---|---|---|---|
| 7,382,622 B2 * | 6/2008 | Li et al. | | 361/719 |
| 7,672,136 B2 * | 3/2010 | He et al. | | 361/719 |
| 7,990,713 B2 * | 8/2011 | Liu et al. | | 361/700 |
| 7,990,718 B2 * | 8/2011 | Xia et al. | | 361/710 |
| 8,059,410 B2 * | 11/2011 | Chen et al. | | 361/719 |
| 2004/0001315 A1 * | 1/2004 | Li | | 361/697 |
| 2009/0040729 A1 * | 2/2009 | Deng et al. | | 361/710 |
| 2011/0149516 A1 * | 6/2011 | Yang | | 361/697 |

FOREIGN PATENT DOCUMENTS

| | | |
|---|---|---|
| TW | M276267 U | 9/2005 |
| TW | I305825 B | 2/2009 |

* cited by examiner

*Primary Examiner* — Gregory Thompson
(74) *Attorney, Agent, or Firm* — Chun-Ming Shih; HDLS IPR Services

(57) ABSTRACT

The heat sink fastener includes a heat conductive board and a flexible metallic wire. The heat conductive board has a pair of pivot portions. The flexible metallic wire has a pair of flexible arms and a middle portion connecting therebetween. Each flexible arm connects to the pivot portion. The pivot portion side of the heat conductive board is formed with a blocking sheet. The middle portion is provided with a bend for being blocked by the blocking sheet. When the flexible metallic wire is hooked to a ring on a circuit board, it will generate pressure to the heat conductive board resulting from the bent flexible arms and the blocked middle portion.

20 Claims, 6 Drawing Sheets

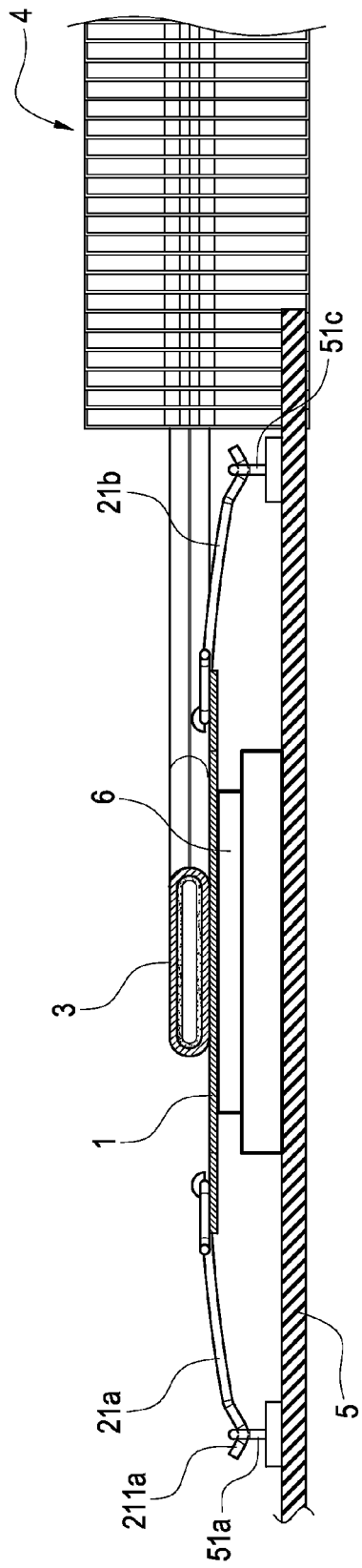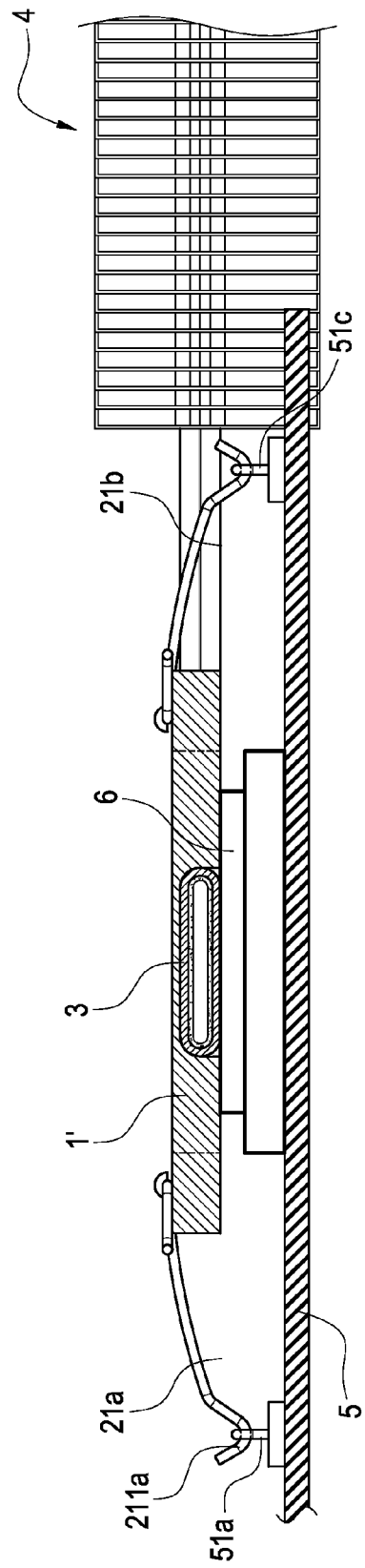

THIN FASTENER OF HEAT SINK

BACKGROUND OF THE INVENTION

1. Technical Field

The invention relates to heat sinks, particularly to fasteners of heat sinks.

2. Related Art

With continuous improvement of semiconductor devices, the requirements to heat sinks also increase. On the other hand, electronic devices also constantly tend to be lighter, thinner, shorter and smaller. Thus heat sinks need not only to further improve to satisfy the requirements of heat dissipation of electronic devices, but also to be lighter and thinner than before.

Taiwan patent No. 1305825 discloses a typical heat sink fastener of the CPU (hereinafter "TW825"). TW 825 uses a heat conductive board attached on the CPU, so the heat conductive plate must exert pressure on the CPU. In TW825, the heat conductive board is fastened by four flexible pins at corners. Each flexible pin is composed of a screw and a spring. The screws must penetrate the heat conductive board and the motherboard so as to fasten the heat conductive board on the motherboard. Thus the screws must possess a specific length. On the other hand, the heat conductive board must be further provided with sleeves for being passed through by the screws. In sum, this kind of structure is relatively complicated and its overall height and weight is hard to be reduced, too. This is very disadvantageous to the thin-and light design of computers.

Taiwan patent No. M276267 discloses another similar heat sink fastener (hereinafter "TW 267"). TW267 differs from TW825 by fixing two extended plates on the heat conductive board. The heat conductive board is fixed on the circuit board by fastening the extended plates on the circuit board. Thus there still are the drawbacks the same as TW825.

SUMMARY OF THE INVENTION

An object of the invention is to provide a thin fastener of heat sink, which can efficiently simplify the structure of heat sink fastener and reduce overall height and weight. This will be advantageous to the thin and light design of electronic devices.

To accomplish the above object, the fastener of the invention includes a heat conductive board and a flexible metallic wire. The heat conductive board has a pair of pivot portions. The flexible metallic wire has a pair of flexible arms and a middle portion connecting therebetween. Two flexible arms respectively connects to two pivot portions.

To accomplish the above object, the fastener of the invention includes a heat conductive board and a pair of flexible metallic wires. The heat conductive board has a pair of pivot portions. Each the flexible metallic wire has a pair of flexible arms and a middle portion connecting therebetween. Each flexible arm connects to the pivot portion.

The pivot portion side of the heat conductive board is formed with a blocking sheet. The middle portion is provided with a bend for being blocked by the blocking sheet. When the flexible metallic wire is hooked to a ring on a circuit board, it will generate pressure to the heat conductive board resulting from the bent flexible arms and the blocked middle portion.

BRIEF DESCRIPTION OF THE DRAWINGS

FIG. 4 is a cross-sectional view of the first embodiment of the invention;

FIG. 5 shows another shape of the heat conductive board;

DETAILED DESCRIPTION OF THE INVENTION

Figure 1:
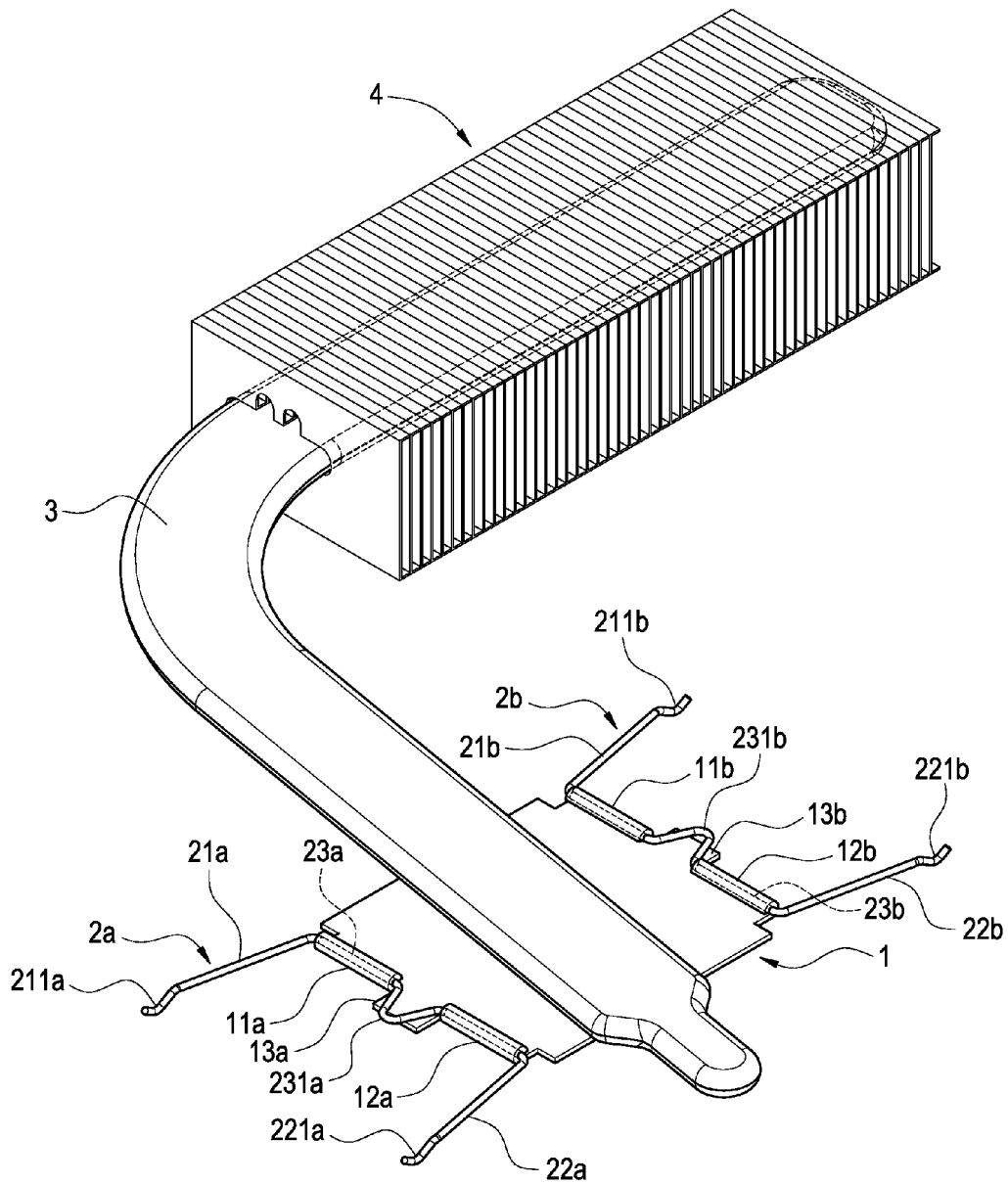
FIG. 1 is a perspective view of the first embodiment of the invention.

Please refer to FIG. 1, which is a perspective view of the first embodiment of the invention. Roughly, the heat sink fastener of the invention includes a heat conductive board 1 and two flexible metallic wires 2a,2b.

Two opposite sides of the heat conductive board 1 are separately provided with two pivot portions. In this embodiment, each pivot portion is a pair of hollow cylinders 11a, 12a;11b,12b. Each pair of hollow cylinders 11a,12a;11b,12b is arranged in a line and may be formed by curling an edge of the heat conductive board 1. A blocking sheet 13a,13b is formed between each pair of hollow cylinders 11a,12a;11b, 12b. The blocking sheets 13a,13b are coplanar to the heat conductive board 1 and protrude from the two pairs of hollow cylinders 11a,12a;11b,12b.

Each of the two flexible metallic wires 2a,2b is of a U shape. It can be defined into a middle portion 23a,23b and two flexible arms 21a,22a;21b,22b. The middle portion 23a or 23b penetrates a pair of hollow cylinders 11a,12a or 11b,12b to form a pivotal connection. And an exposed portion of the middle portion 23a or 23b at the location of the blocking sheet 13a or 13b is formed with a bend 231a,231b. Preferably, the bend 231a or 231b is of a V shape. Of course, it may also be of any other proper shapes. Each bend 231a or 231b is blocked by the blocking sheet 13a or 13b to make the middle portion 23a or 23b not able to rotate downwards. Besides, free ends of the flexible arms 21a,22a;21b,22b are preferably separately formed with hooks 211a,221a;211b,221b for being fixed on a circuit board. The top of the heat conductive board 1 may be attached by an evaporation end of a heap pipe 3. The condensation end of the heat pipe 3 may connect to a fin set 4.

Figure 2:
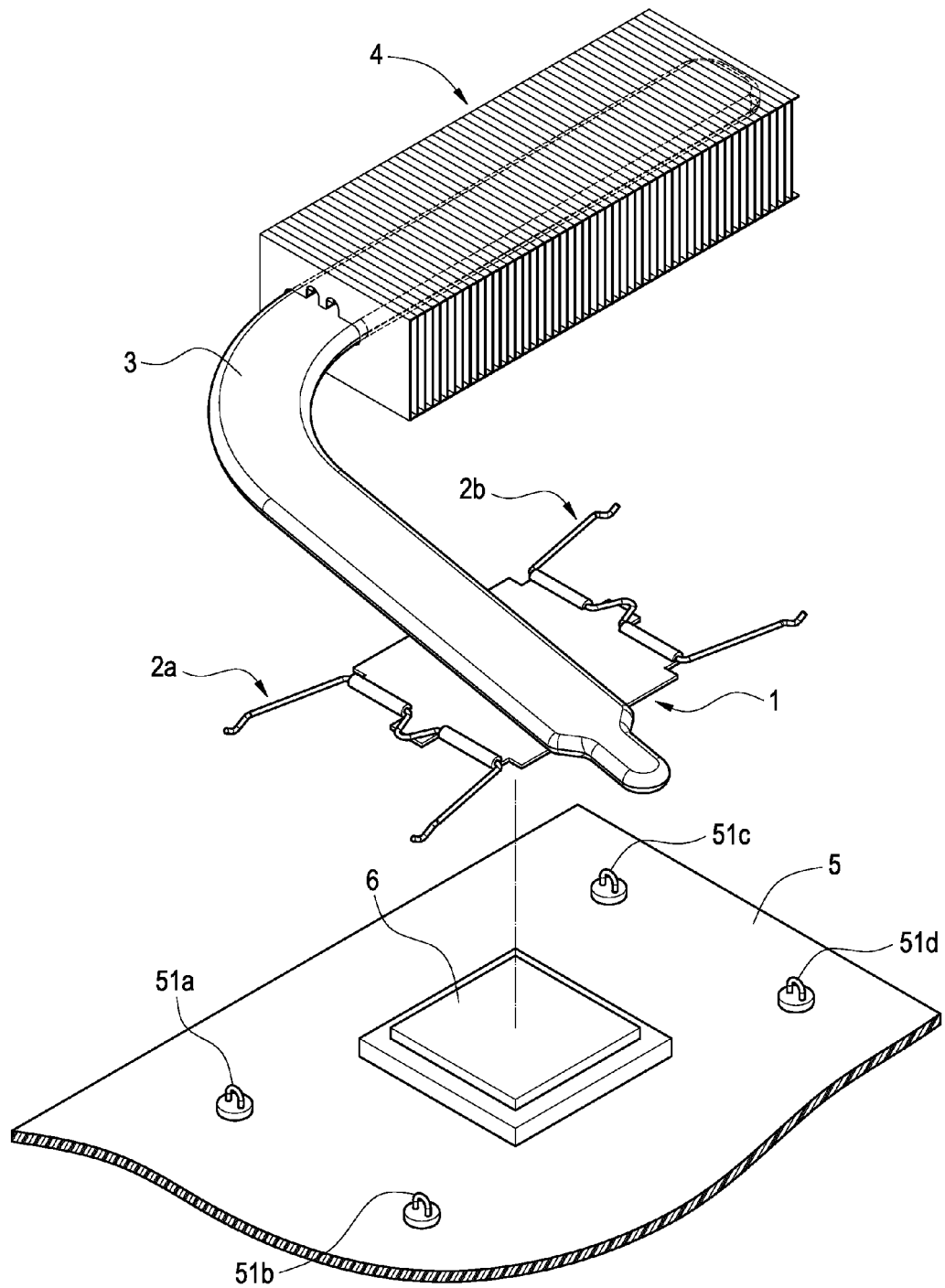
FIG. 2 is a schematic view of the invention and an electronic component to be mounted.
Figure 3:
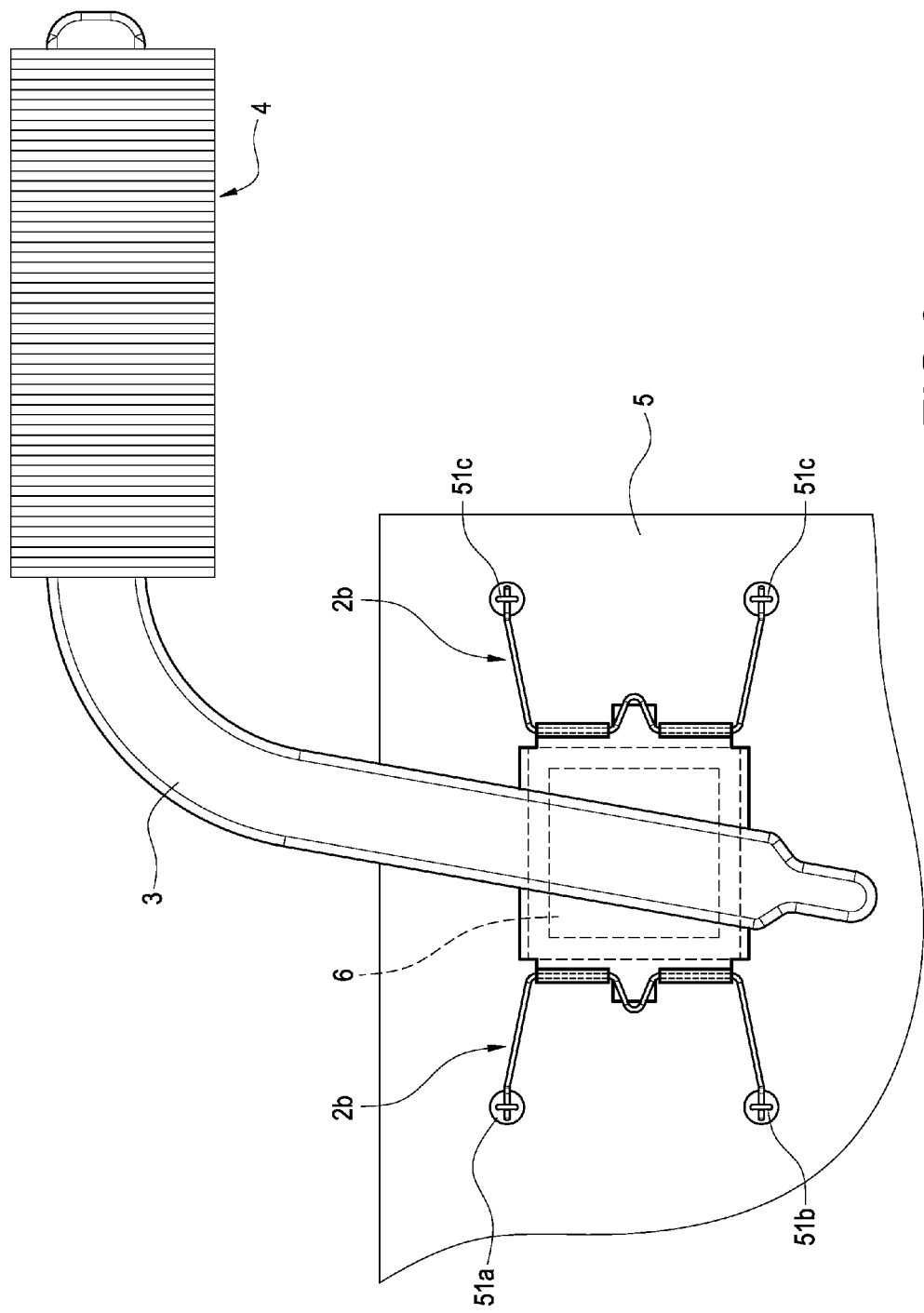
FIG. 3 is a top view of the first embodiment of the invention.

Please refer to FIG. 2, which is a schematic view of the invention and an electronic component to be mounted. The heat conductive board 1 is used to be mounted on the electronic component 6 on a circuit board 5. There are four rings 51a,51b,51c,51d on the circuit board 5 around the electronic component 6. These rings 51a,51b,51c,51d are separately corresponding to the four hooks 211a,221a;211b,221b. After the heat conductive board 1 is put on the electronic component 6, the flexible arms 21a,22a;21b,22b are slightly bent to make the hooks 211a,221a,211b,221b separately pass through the rings 51a,51b,51c,51d as shown in FIGS. 3 and 4. At this time, the bends 231a,231b are blocked by the blocking sheets 13a,13b so as to exert pressure to the heat conductive board 1. As a result, the heat conductive board 1 clings to the electronic component 6 to form a very great thermal contact.

The heat sink fastener of the invention does not require any screw. The invention only employs elasticity from the deformed flexible metallic wires 2a,2b to generate pressure. Not only can the structure be simplified, but also the weight can be reduced, and even the height also can be shortened. These are advantageous to the thin and light design of electronic devices.

FIG. 5 shows another shape of the heat conductive board. The heat conductive board 1' has relatively larger thickness which can sheathe the heat pipe 3. This can make a better thermo-conductivity between the heat conductive board 1' and heat pipe 3 because of larger contact area and tighter connection.

Figure 6:
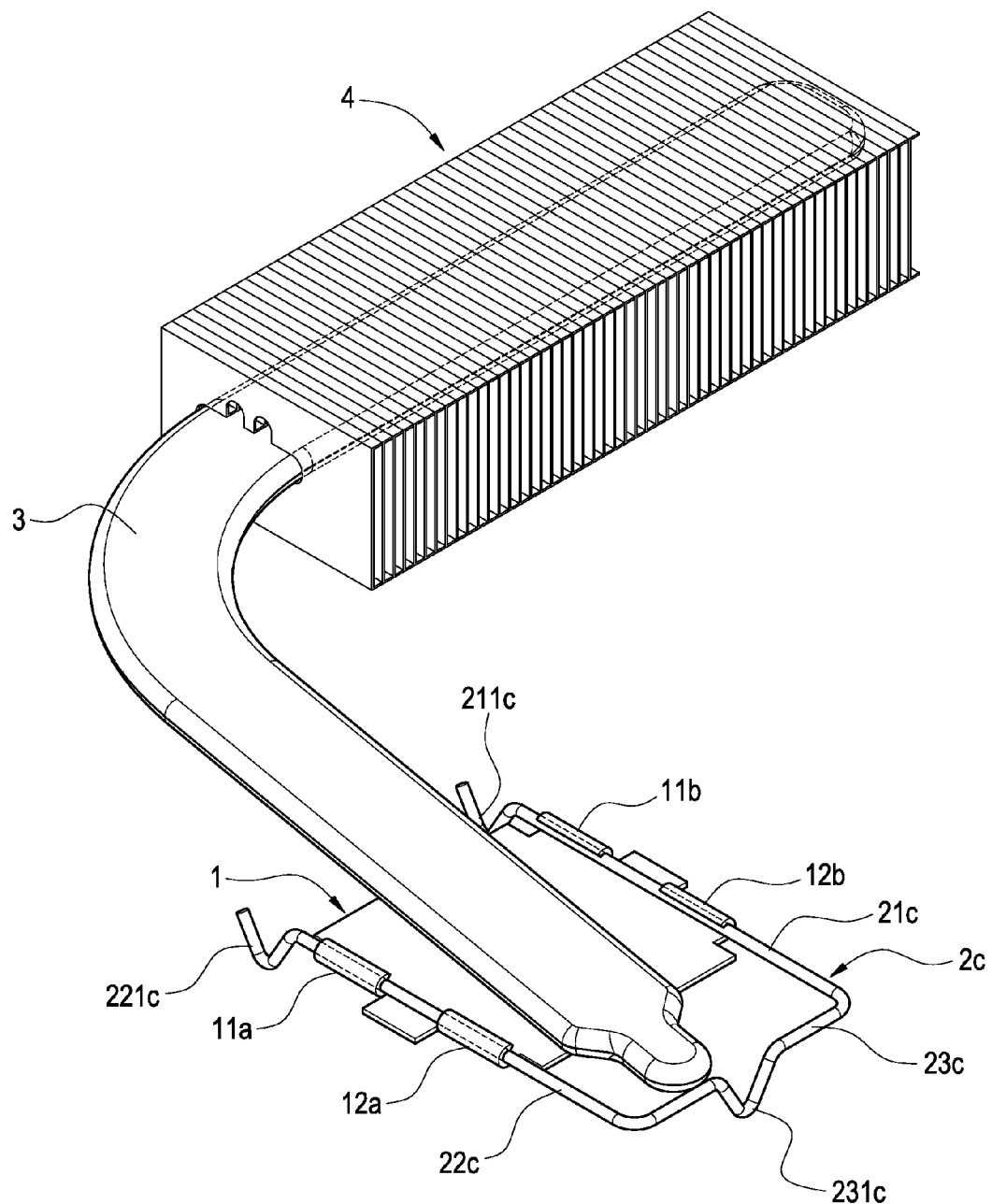
FIG. 6 shows the second embodiment of the invention.

FIG. 6 shows the second embodiment of the invention. In this embodiment, the flexible metallic wire 2c is of a U shape, which can be defined into a middle portion 23c and two flexible arms 21c,22c. The two flexible arms 21c,22c separately penetrate through two pairs of hollow cylinders 11b, 12b;12b,12a. The middle portion 23c is exposed out of one side of the heat conductive board 1. The middle portion 23c and two free ends of the flexible arms 21c,22c are separately formed with hooks 211c,221c,231c for penetrating through rings as shown in the abovementioned embodiment. Similarly, the top of the heat conductive board 1 may be attached by a heat pipe 3 connecting with a fin set 4. In this embodiment, the flexible metallic wire 2c has three hooks 211c,221c, 231c, so there should be three rings disposed on a circuit board (not shown) for being penetrated by the hooks 211c, 221c,231c.

Figure 7:
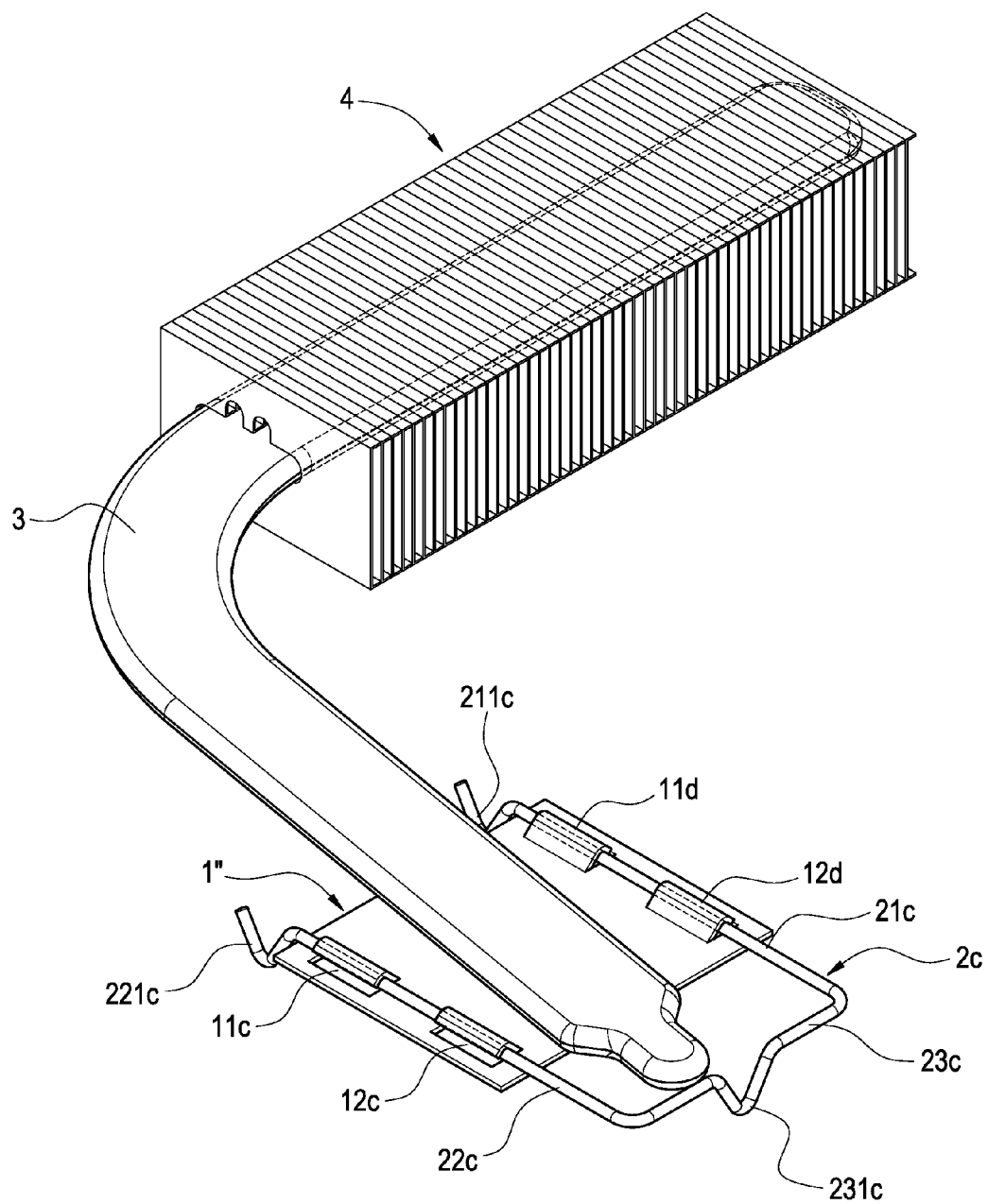
FIG. 7 shows the third embodiment of the invention.

FIG. 7 shows the third embodiment of the invention. In this embodiment, two pivot portions of the heat conductive board 1" are separately provided with two pairs of hollow cylinders 11c,12c;11d,12d. Each pair of hollow cylinders 11c,11d;12c, 12d formed by stamping and is arranged in a line. Two flexible arms 21c,22c of the flexible metallic wire separately penetrate through two pairs of hollow cylinders 11d,12d;11c,12c. Similarly, the top of the heat conductive board 1 may be attached by a heat pipe 3 connecting with a fin set 4.

While the forgoing is directed to preferred embodiments of the present invention, other and further embodiments of the invention may be devised without departing from the basic scope thereof. As such, the appropriate scope of the invention is to be determined according to the claims.

What is claimed is:

1. A heat sink fastener comprising:
    a heat conductive board having a pair of pivot portions;
    a flexible metallic wire having a pair of flexible arms and a middle portion connecting therebetween, and two flexible arms connecting to two pivot portions, respectively,
    wherein a free end of each flexible arm is formed with a hook, and the middle portion is also formed with a hook.

2. The heat sink fastener of claim 1, wherein the flexible metallic wire is of a U shape.

3. The heat sink fastener of claim 1, wherein each pivot portion is a hollow cylinder formed by curling an edge of the heat conductive board, and the flexible arm penetrates through the hollow cylinder.

4. The heat sink fastener of claim 1, further comprising a ring mounted on a circuit board for being penetrated by the hook.

5. The heat sink fastener of claim 1, wherein the heat conductive board connects a heat pipe.

6. The heat sink fastener of claim 5, wherein an end of the heat pipe is sheathed in the heat conductive board.

7. The heat sink fastener of claim 1, wherein each pivot portion is a hollow cylinder formed by stamping, and the flexible arm penetrates through the hollow cylinder.

8. A heat sink fastener comprising:
    a heat conductive board having a pair of pivot portions;
    a pair of flexible metallic wires, each having a pair of flexible arms and a middle portion connecting therebetween, and the middle portion connecting to one of the pair of pivot portions,
    wherein each pivot portion is a pair of hollow cylinders formed by curling an edge of the heat conductive board, and the flexible arm penetrates through the pair of hollow cylinders.

9. The heat sink fastener of claim 8, wherein each flexible metallic wire is of a U shape.

10. The heat sink fastener of claim 8, wherein a blocking sheet is formed at a gap between the pair of hollow cylinders, and each the middle portion is formed with a bend for being blocked by the blocking sheet.

11. The heat sink fastener of claim 8, wherein a free end of each flexible arm is formed with a hook.

12. The heat sink fastener of claim 11, further comprising a ring mounted on a circuit board for being penetrated by the hook.

13. The heat sink fastener of claim 8, wherein the heat conductive board connects a heat pipe.

14. The heat sink fastener of claim 13, wherein an end of the heat pipe is sheathed in the heat conductive board.

15. A heat sink fastener comprising:
    a heat conductive board having a pair of pivot portions;
    a pair of flexible metallic wires, each having a pair of flexible arms and a middle portion connecting therebetween, and the middle portion connecting to one of the pair of pivot portions,
    wherein each pivot portion is a hollow cylinder formed by stamping, and the flexible arm penetrates through the hollow cylinder.

16. The heat sink fastener of claim 15, wherein each flexible metallic wire is of a U shape.

17. The heat sink fastener of claim 15, wherein a free end of each flexible arm is formed with a hook.

18. The heat sink fastener of claim 17, further comprising a ring mounted on a circuit board for being penetrated by the hook.

19. The heat sink fastener of claim 15, wherein the heat conductive board connects a heat pipe.

20. The heat sink fastener of claim 19, wherein an end of the heat pipe is sheathed in the heat conductive board.

* * * * *